(12) United States Patent
Wang et al.

(10) Patent No.: US 11,552,039 B2
(45) Date of Patent: Jan. 10, 2023

(54) EMBEDDED PACKAGING MODULE AND MANUFACTURING METHOD FOR THE SAME

(71) Applicant: Delta Electronics (Shanghai) CO., LTD, Shanghai (CN)

(72) Inventors: Zengsheng Wang, Shanghai (CN); Xuetao Guo, Shanghai (CN); Kai Lu, Shanghai (CN); Hui Li, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 112 days.

(21) Appl. No.: 16/730,024

(22) Filed: Dec. 30, 2019

(65) Prior Publication Data

US 2020/0251438 A1 Aug. 6, 2020

(30) Foreign Application Priority Data

Feb. 1, 2019 (CN) .......................... 201910105644.X

(51) Int. Cl.
*H01L 21/56* (2006.01)
*H01L 23/00* (2006.01)

(52) U.S. Cl.
CPC .............. *H01L 24/24* (2013.01); *H01L 21/56* (2013.01); *H01L 24/09* (2013.01); *H01L 24/25* (2013.01);
(Continued)

(58) Field of Classification Search
CPC . H01L 2224/73101; H01L 2224/73209; H01L 2224/4073; H01L 24/09;
(Continued)

(56) References Cited

U.S. PATENT DOCUMENTS

| 7,902,666 B1 | 3/2011 | Hsu et al. | |
|---|---|---|---|
| 2006/0043549 A1* | 3/2006 | Hsu | H01L 24/19 257/678 |
| 2014/0264831 A1* | 9/2014 | Meyer | H01L 21/56 257/737 |

FOREIGN PATENT DOCUMENTS

| CN | 1463032 A | 12/2003 |
|---|---|---|
| CN | 1510388 A | 7/2004 |
| CN | 1682379 A | 10/2005 |

(Continued)

OTHER PUBLICATIONS

The 1st Office Action dated Jun. 28, 2021 for CN patent application No. 201910105644.X.
(Continued)

*Primary Examiner* — Tucker J Wright
(74) *Attorney, Agent, or Firm* — Qinghong Xu

(57) ABSTRACT

The present disclosure relates to an embedded packaging module comprising a first semiconductor device, a first packaging layer and a first wiring layer, the first semiconductor device having a first and a second face, at least two positioning bulges and at least one bonding pad being provided on the first face of the first semiconductor device; the first packaging layer being formed on both the first face and a surface adjacent to the first face, the positioning bulges being positioned in the first packaging layer, at least one first via hole being provided in the first packaging layer, the bottom of the first via hole being positioned in the bonding pad and contacting with the bonding pad; the first wiring layer being positioned on the side of the first packaging layer away from the first semiconductor device and being electrically connected with the bonding pad through the first via hole.

16 Claims, 19 Drawing Sheets

(52) U.S. Cl.
CPC ...... *H01L 24/82* (2013.01); *H01L 2224/0903* (2013.01); *H01L 2224/0916* (2013.01); *H01L 2224/09151* (2013.01); *H01L 2224/24137* (2013.01); *H01L 2224/24155* (2013.01); *H01L 2224/24175* (2013.01); *H01L 2224/24991* (2013.01); *H01L 2224/2518* (2013.01); *H01L 2224/8213* (2013.01)

(58) Field of Classification Search
CPC .............. H01L 24/24; H01L 24/82; H01L 2224/08151–08268; H01L 2224/16151–16268; H01L 2224/32151–32268; H01L 2224/8213; H01L 2224/0213; H01L 2224/0217; H01L 2223/54426; H01L 23/544; H01L 21/68; H01L 2021/60067–6009; H01L 2021/10135; H01L 2021/10165; H01L 2224/767–76756
See application file for complete search history.

(56) References Cited

FOREIGN PATENT DOCUMENTS

| | | |
|---|---|---|
| CN | 100336426 C | 9/2007 |
| CN | 101355064 A | 1/2009 |
| CN | 102348328 A | 2/2012 |
| CN | 102820284 A | 12/2012 |
| CN | 102348328 B | 5/2015 |
| CN | 105047652 A | 11/2015 |
| CN | 111415908 A | 7/2020 |
| EP | 1814154 A1 | 8/2007 |
| EP | 2615638 A2 | 7/2013 |

OTHER PUBLICATIONS

The 1st Office Action dated Nov. 17, 2021 for IN patent application No. 201934054014.
Notice of Allowance dated Mar. 25, 2022 for Chinese Patent Application No. 201910105644.X.

\* cited by examiner

EMBEDDED PACKAGING MODULE AND MANUFACTURING METHOD FOR THE SAME

CROSS REFERENCE

This application is based upon and claims priority to Chinese Patent Application No. 201910105644.X, filed on Feb. 1, 2019, which is incorporated herein by reference in its entirety.

TECHNICAL FIELD

The present disclosure relates to the technology field of chip packaging, and in particular, to an embedded packaging module and a manufacturing method for the same.

BACKGROUND

With the development and improvement of technology, chips have been used more and more widely in various kinds of electronic products, while the size of chips, and then the package dimensions of the same, have been increased due to the increasing of the power and current of chips, which thereby represents serious ordeal to the package reliability of chips. Moreover, various kinds of electronic products exhibit increasingly high demand to the chip integration, while requiring for a lower stack height of chips.

At present, in order for improving the reliability of chip packaging, and also for decreasing the stack height of chips, an embedded packaging structure has become a common form in the chip packaging structure, wherein a chip is packaged through an embedded structure. However, in a packaging process the yield and reliability of embedded packaging structure remain low, due to the effect of process accuracy, etc.

It should be noted that the information disclosed in the above section of background is only provided for enhancing the understanding of background of the present disclosure, so that those information does not form a part of the prior art known by those ordinarily skilled in the art.

SUMMARY

The present disclosure provides an embedded packaging module and a manufacturing method for the same, and thereby, at least to some extent, to overcome one or more problems caused by the limitation and deficiencies of the prior art.

According to one aspect of the present disclosure, an embedded packaging module is provided, the embedded packaging module comprises:
 a first semiconductor device having a first face and a second face, at least two positioning bulges and at least one bonding pad being provided on the first face of the first semiconductor device;
 a first packaging layer formed on the first face of the first semiconductor device and a face adjacent to the first face, the positioning bulges being positioned in the first packaging layer, at least one first via hole being provided in the first packaging layer, the bottom of the first via hole being positioned in the bonding pad and contacting the bonding pad;
 a first wiring layer positioned on the side of the first packaging layer away from the first semiconductor device, and being electrically connected with the bonding pad through the first via hole.

According to another aspect of the present disclosure, a manufacturing method for an embedded packaging module is provided, the method comprises:
 providing a first semiconductor device, a first face of the first semiconductor device having at least one bonding pad;
 providing at least two positioning bulges on the first face of the first semiconductor device;
 press-bonding a first packaging layer and covering both the first face of the first semiconductor device and a face adjacent to the first face;
 processing at least one first via hole in the first packaging layer by a laser drilling process, wherein a pattern identification point for position confirmation of laser drilling is the positioning bulge on the first face of the first semiconductor device, such that the bottom of the first via hole being positioned in the region of the bonding pad and contacting the bonding pad, and that the projections of the first via hole and the positioning bulges on the first face of the first semiconductor device doing not overlap;
 filling the first via hole with metal;
 forming a first wiring layer, the first wiring layer being positioned on the side of the first packaging layer away from the first semiconductor device, and the first wiring layer being electrically connected with the bonding pad through the first via hole.

It should be understood that the above general description and the following detailed description are merely exemplary and explanatory and are not intended to limit the present disclosure.

BRIEF DESCRIPTION OF THE DRAWINGS

The accompanying drawings are hereby incorporated in and constitute part of the specification, show the embodiments of the present disclosure and are intended to explain the principle of the present disclosure together with the description. Apparently, the drawings as described below are only of some embodiments of the present disclosure, and from these drawings, those of ordinary skill in the art may acquire other drawings without paying out inventive works.

DETAILED DESCRIPTION

Figure 1:
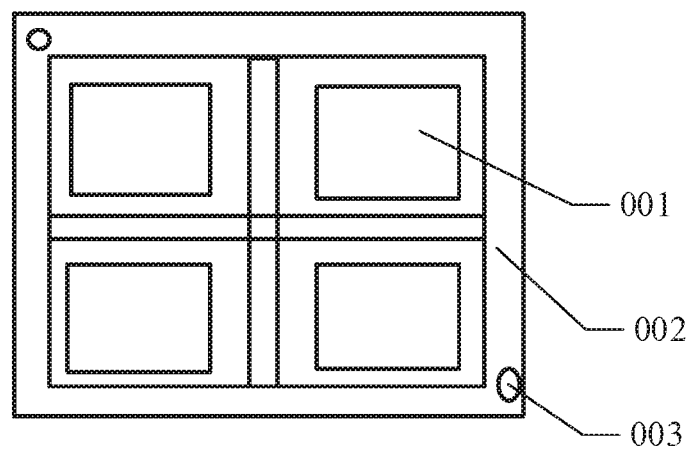
FIG. 1 is a structural schematic diagram of a chip packaging structure provided based on the related art.

Exemplary embodiments will now be described more comprehensively with reference to the accompanying drawings. Nevertheless, the exemplary embodiments can be embodied in various forms, and should not be construed as those embodiments illustrated herein. Instead, these embodiments are provided so that this disclosure will be thorough and complete, and that the concept of the exemplary embodiments can be fully conveyed to those skilled in the art. The same reference numerals in the drawings denote the same or similar components, and the repetitive description thereof will be omitted.

Although the specification uses the terms of relativity, such as "above", "blow" to indicate a position relationship of one component relative to another, these terms is used in the disclosure only for illustrative purposes, for example, in accordance with the direction depicted in the drawings. It would be understood that if the arrangement as shown is turned upside down, the component which is described as "above . . . " will become the component below. And when a certain structure is indicated as "above/on" other structure, it may mean that the structure is formed on other structure integrally, or the structure is provided on other structure directly, or provided on other structure "indirectly" through another structure.

The wordings "a", "one", "the", "said" and "at least one" is to indicate the presence of one or more element/component/etc.; the wordings "include/comprise" and "have" is to indicate a non-exclusive meaning "include-in" and mean that other element/component/etc. may present except for those listed; and the wordings "first", "second" and "third" are used only as marks, without intending to limit the number of the object.

A chip packaging structure is provided according to the related art, as shown in FIG. 1. In the chip packaging structure a chip 001 is packaged within a frame 002, and a via hole, through which the chip 001 is connected with an external circuit, may be formed in a packaging layer by using a laser processing, an identification point 003 for laser processing is provided at the frame and thus the via hole is positioned and processed through the identification point 003. If the chip, when mounting in the frame, has a position deviating from an ideal position, or if the position of the chip in the frame deviates from the ideal position due to the process accuracy, a deviation of position of the via hole in the chip would be caused, resulting in a misalignment between the via hole and the bonding pad of the chip, which in turn affects the process yield, the current-flowing capability and the reliability of module.

Figure 2:
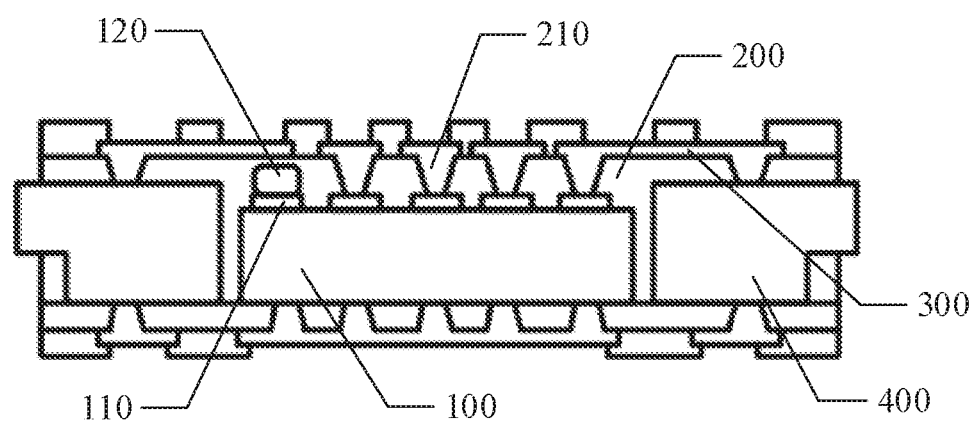
FIG. 2 is a structural schematic diagram of a first embedded packaging module according to the present disclosure.
Figure 3:
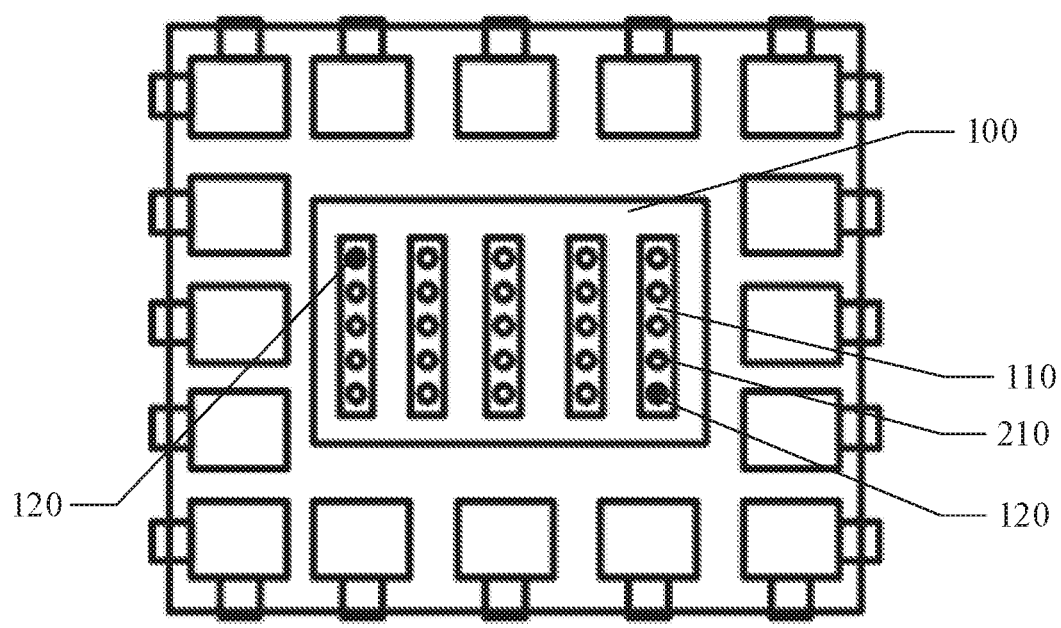
FIG. 3 is a schematic diagram of distribution of positioning bulges in an embedded packaging module according to the present disclosure.

In the exemplary embodiment, an embedded packaging module is firstly provided, as shown in FIG. 2 and FIG. 3, the embedded packaging module comprises a first semiconductor device 100, a first packaging layer 200 and a first wiring layer 300. The first semiconductor device 100 has a first face and a second face, on the first face of the first semiconductor device 100 is provided at least two positioning bulges 120 and at least one bonding pad 110. The first packaging layer 200 is formed on both the first face of the first semiconductor device 100 and a face adjacent to the first face, and the positioning bulges 120 are positioned within the first packaging layer 200. At least one first via hole 210 is provided in the first packaging layer 200, and a bottom of the first via hole 210 lies in the bonding pad 110 and contacts the bonding pad 110. The first wiring layer 300 lies on the side of the first packaging layer 200 away from the first semiconductor device 100, and is electrically connected with the bonding pad 110 through the first via hole 210.

In the embodiment, the first via hole 210 may be formed in first packaging layer 200 by using a laser processing, and the positioning bulge 120 may be used as an anchor point in the laser processing, since the positioning bulge 120 is positioned on the first semiconductor device 100, the problem of incorrect positioning in the laser processing, which is caused by the process accuracy or the like, is avoided.

The semiconductor device as described in the embodiments of the present disclosure may be a chip or the like, and the first face of the first semiconductor device 100 may be an electrode surface, the second face may be a back face opposite to the electrode surface. The positioning bulge 120 is positioned on the electrode surface, and also on the electrode surface the first packaging layer 200 is deposited. The positioning bulge 120 may be enveloped within the first packaging layer 200, or it may also be exposed to the first packaging layer 200, e.g., the upper surface of the positioning bulge 120 is flush with the upper surface of the first packaging layer 200.

The embedded packaging module as presented in the embodiments of the present disclosure improves the position accuracy of processing the first via hole 210 in the first packaging layer 200, due to providing at least two positioning bulges 120 on the first face of the first semiconductor device 100 as anchor points, and also satisfies the need of current flowing by virtue of the first via hole 210. As the position accuracy of processing of the via hole improves, the number of via hole in the bonding pad 110 and the diameter of via hole can be increased, so as to further improve the current-flowing capability and the heat dissipation capability of the via hole, and meanwhile the transverse flow distance of the electrical current in the chip bonding pad can be decreased so as to reduce the internal loss of current of the chip, and thereby improve the reliability of packaging.

Hereinafter, a detailed description will be made to embedded packaging modules provided by the embodiments of the present disclosure.

Figure 4:
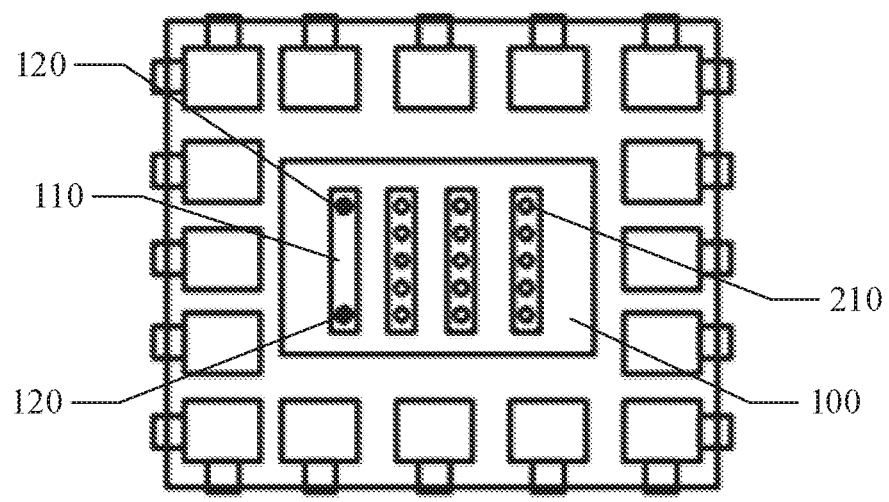
FIG. 4 is another schematic diagram of distribution of positioning bulges in an embedded packaging module according to the present disclosure.
Figure 5:
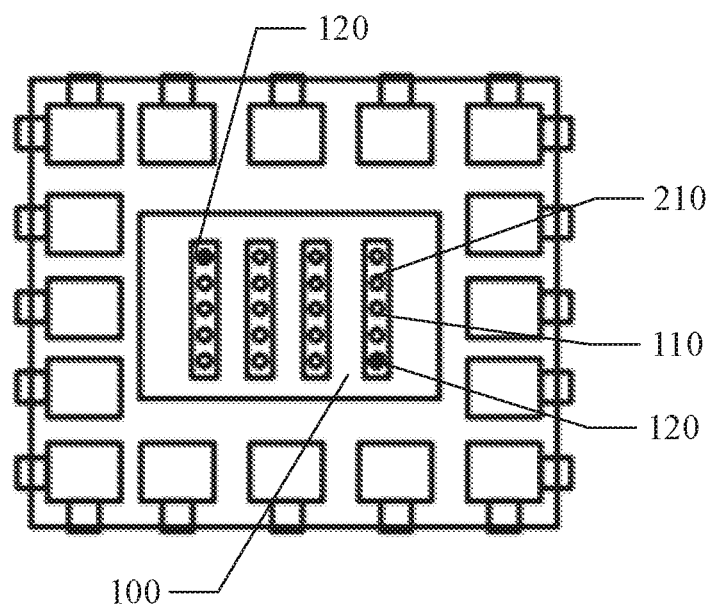
FIG. 5 is another schematic diagram of distribution of positioning bulges in an embedded packaging module according to the present disclosure.

In some embodiments of the present disclosure, at least one positioning bulge 120 of the at least two positioning bulges 120 is provided on the bonding pad 110, and the first via hole 210 is not provided on that bonding pad 110 on which the positioning bulge 120 is provided. For example, as shown in FIG. 4, two positioning bulges 120 are positioned on one and the same bonding pad 110, and the first via hole 210 is not provided on the bonding pad 110 on which the positioning bulge 120 is provided; or else, as shown in FIG. 5, each of the two positioning bulges 120 is positioned on one bonding pad 110, respectively, and the first via hole 210 is not provided on the bonding pad 110 on which the positioning bulge 120 is provided.

Figure 6:
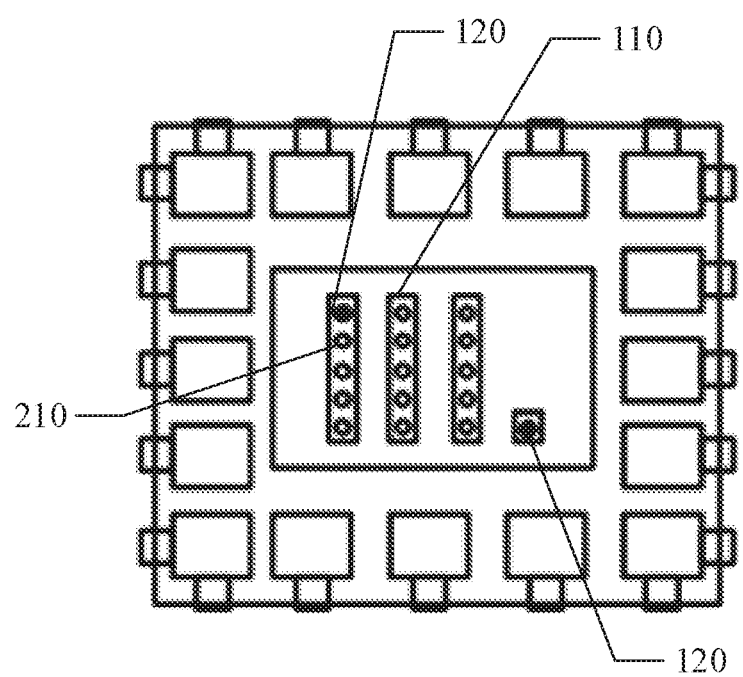
FIG. 6 is another schematic diagram of distribution of positioning bulges in an embedded packaging module according to the present disclosure.
Figure 7:
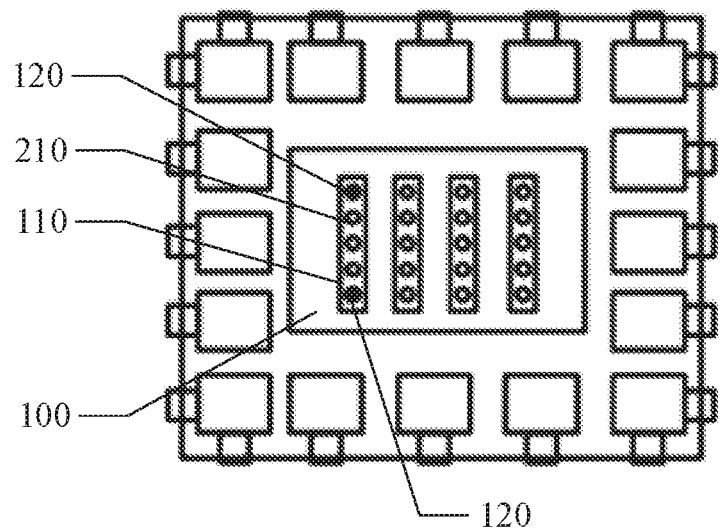
FIG. 7 is another schematic diagram of distribution of positioning bulges in an embedded packaging module according to the present disclosure.

In other embodiments of the present disclosure, at least one positioning bulge 120 of the at least two positioning bulges 120 is provided on the bonding pad 110, and at least one first via hole 210 is also provided on that bonding pad 110 on which the positioning bulge 120 is provided. For example, as shown in FIG. 6, each of the two positioning bulges 120 is positioned on one bonding pad 110, respectively, and at least one first via hole 210 is also provided on the bonding pad 110 on which the positioning bulge 120 is provided; or else, as shown in FIG. 7, two positioning bulges 120 are positioned on one and the same bonding pad 110, and the first via hole(s) 210 is also provided on the bonding pad 110; or else, as shown in FIG. 3, two positioning bulges 120 are positioned on two bonding pads 110, respectively, and the first via hole(s) 210 is also provided on each of the two bonding pad 110. The positioning bulge 120 and the first via hole 210 are both provided on a surface of the first semiconductor device 100, which may not only improve the position accuracy of laser drilling, but also allow a large electrical current that coincides with the power module flowing through.

In the embodiment, the projections of the first via hole 210 and the positioning bulge 120 on the first face of the first semiconductor device 100 do not overlap. That is, the first via hole 210 and the positioning bulge 120 are independent of each other, whereas the present disclosure is not limited thereto.

In practical application, naturally, the positioning bulge 120 may also be positioned on a region of the first face of the first semiconductor device 100 that is not occupied by the bonding pad 110, and so on, the embodiments of the present disclosure make no specific limitation thereto.

Figure 8:
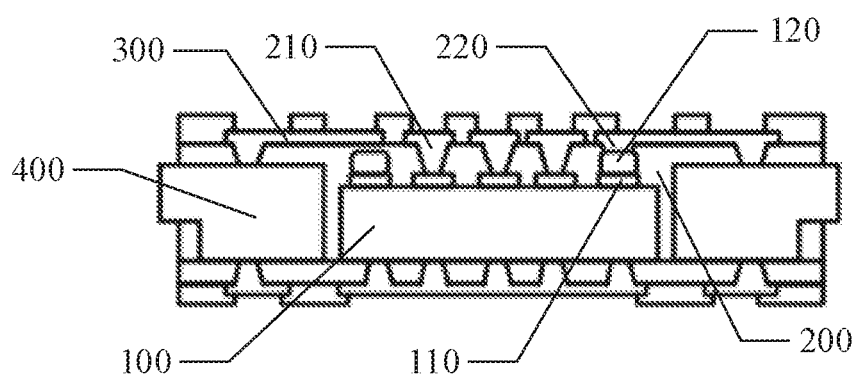
FIG. 8 is a structural schematic diagram of a second embedded packaging module in accordance to the present disclosure.

As shown in FIG. 8, when the positioning bulges 120 are enveloped in the first packaging layer 200, the first packaging layer 200 is also provided with at least one second via hole 220, the second via hole 220 and the positioning bulge 120 contact with each other and their projections on the first face of the first semiconductor device 100 at least partly overlap. Among which at least part of the positioning bulges 120 are positioned on at least one of the bonding pads 110, the second via hole 220 contacts the positioning bulge 120 provided on the bonding pad 110 and their projections at the first face of the first semiconductor device 100 at least partly overlap. In practical application, it may be selected to provide the second via hole 220 on a part or all of the positioning bulges 120 based on actual demand.

The first semiconductor device 100 and the first wiring layer 300 are connected through the positioning bulge 120 and the second via hole 220, which can improve the utilization of the bonding pad 110, and which is especially suitable for the packaging of semiconductor device having a smaller bonding pad 110.

It should be noted that in the embodiments of the present disclosure, all of the via hole may be solid metal via holes so as to reduce the electrical resistance and thereby to improve the current-flowing capability and reduce energy consumption. Naturally, in the practical application, the material of the via hole can also be another conductive material, and the via hole can also have a non-solid construction, the embodiments of the present disclosure make no specific limitation thereto. The positioning bulge 120 can be made by a conductive material and is electrically connected with the bonding pad 110, the second via hole 220 can be electrically connected with the first wiring layer 300.

Further, the embedded packaging module also comprises a package frame 400, according to the package frame 400 presented in some embodiments of the disclosure, the package frame 400 has a holding region 410, such as a room formed by wrapping, a room formed by channeling, etc. The first semiconductor device 100 is provided in the holding region 410, and in some embodiments of the disclosure, the package frame 400 may be a PCB, and the holding region 410 is a blind hole or a through hole or the like provided on the PCB. The holding region 410 may have a rectangular cross-section, while in the practical application, the cross-section of the holding region 410 may be circle or may have an irregular shape formed by a number of rectangles, and so on, and the embodiments of the present disclosure make no specific limitation thereto. In other embodiments of the present disclosure, the package frame 400 may be a lead frame having a holding region 410, the material thereof may be conductive material or insulating material, for example, the lead frame may comprise a number of conductive blocks, these conductive blocks are arranged to form the holding region 410, these conductive blocks may be independent of each other or may be arranged end-to-end, the embodiments of the present disclosure make no specific limitation thereto.

Figure 9:
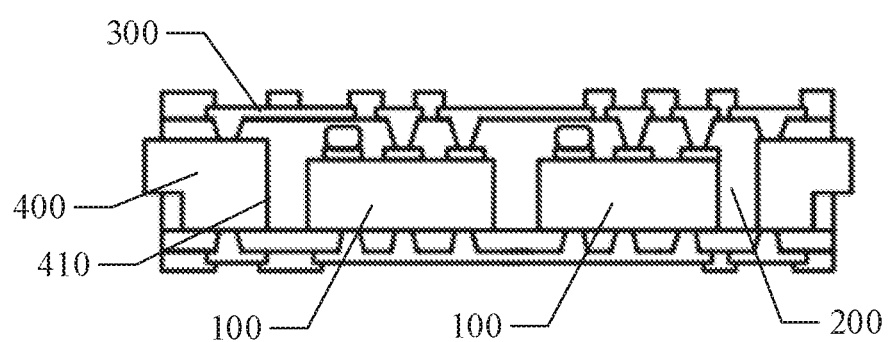
FIG. 9 is a structural schematic diagram of a third embedded packaging module in accordance to the present disclosure.
Figure 10:
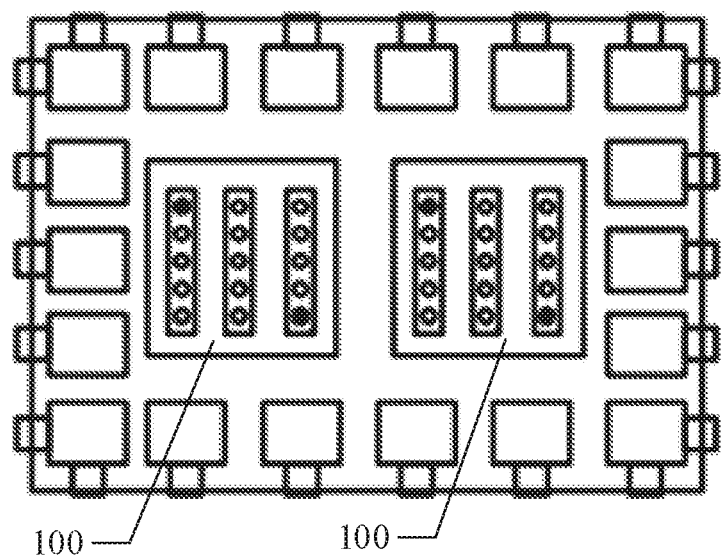
FIG. 10 is a cross-sectional schematic diagram of a fourth embedded packaging module according to the present disclosure.

As shown in FIGS. 9-10, the package frame 400 may include one or more holding regions 410, and one or more semiconductor devices may be provided in the holding region 410. When only one semiconductor device is provided in the holding region 410, the gap between the semiconductor device and the package frame 400 may be filled with a packaging material so as to fix or secure the semiconductor device. When a number of semiconductor devices are provided in the holding region 410, these semiconductor devices may be in an array distribution, and the gaps between the semiconductor devices and the package frame 400, as well as between the adjacent semiconductor devices, are filled with the packaging layer material in order to fix or secure the semiconductor devices. A number of holding regions 410 in the package frame 400 may be in an array distribution.

Figure 12:
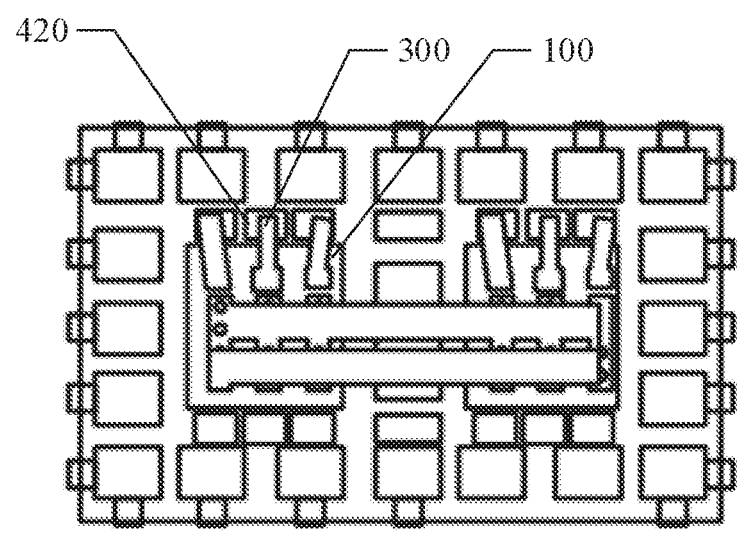
FIG. 12 is a cross-sectional schematic diagram of a sixth embedded packaging module according to the present disclosure.

Further, as shown in FIG. 12, the package frame 400 may also comprise a number of metal blocks 420 that are not connected with one another, and at least one first semiconductor device 100 is electrically connected with at least one of the metal blocks 420 through the first via hole 210 and the first wiring layer 300. A number of metal blocks 420 are used as a pin array extending from the semiconductor device electrode, which can get a nearby lead-out of semiconductor device electrode, so as to shorten the current loop and then reduce energy consumption.

Figure 11:
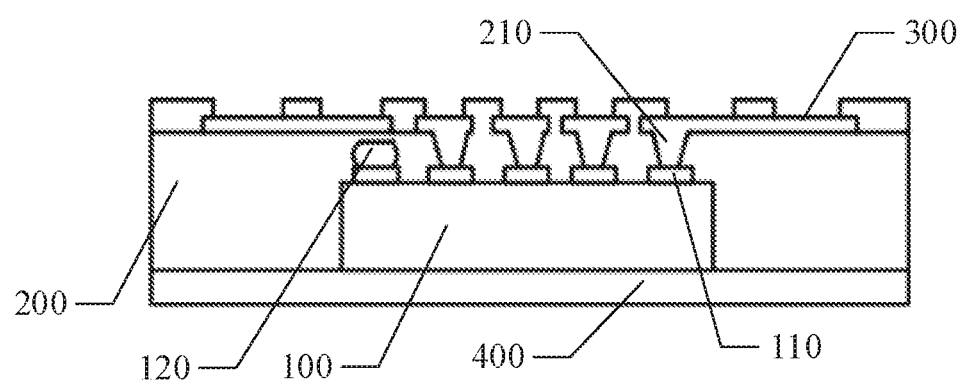
FIG. 11 is a structural schematic diagram of a fifth embedded packaging module according to the present disclosure.

As shown in FIG. 11, another package frame 400 presented in an embodiment of the present disclosure may be a plate structure, the first semiconductor device 100 and the package frame 400 are stacked, and the back face of the first semiconductor device 100 contacts the package frame 400. The first packaging layer 200 cover the first semiconductor device 100, and the first packaging layer 200 can be deposited on the package frame 400 outside of the projection of the first semiconductor device 100, the first packaging layer 200 contacts the package frame 400.

Figure 13:
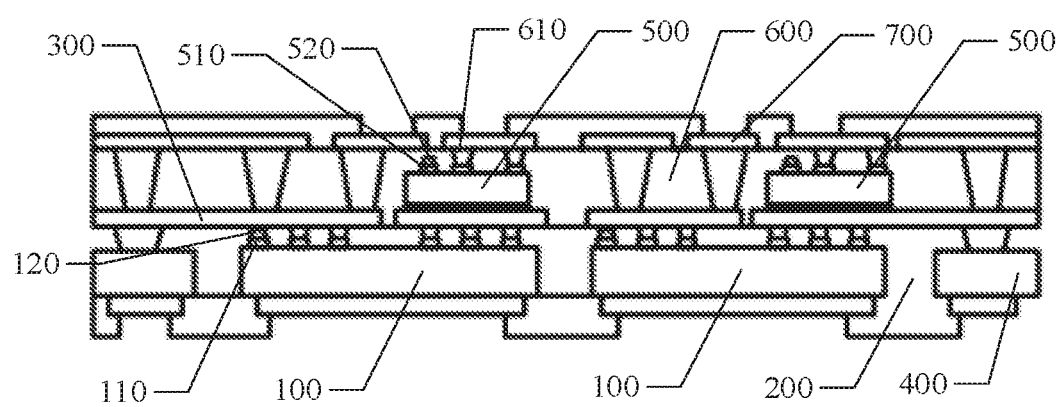
FIG. 13 is a structural schematic diagram of a seventh embedded packaging module according to the present disclosure.

Further, as shown in FIG. 13, the embedded packaging module further comprises: at least one second semiconductor device 500, a third packaging layer 600 and a third wiring layer 700. The at least one second semiconductor device 500 has a first face and a second face, at least two positioning bulges 520 (only one positioning bulge is shown in the figure) and at least one bonding pad 510 are provided on the first face of the second semiconductor device 500, and the second face of the second semiconductor device 500 is connected with the first wiring layer 300. The third packaging layer 600 is formed on the side of the first wiring layer 300 away from the first semiconductor device 100, and covers the second semiconductor device 500. The positioning bulges 520 of the second semiconductor device 500 are positioned in the third packaging layer 600, at least one third via hole 610 is provided in the third packaging layer 600, and the bottom of the third via hole 610 is positioned in region of the bonding pad 510 of the second semiconductor device 500 and contacts the bonding pad 510 of the second semiconductor device 500. The projections of the third via hole 610 and the positioning bulges 520 on the first face of the second semiconductor device 500 do not overlap. The third wiring layer 700 is formed on the third packaging layer 600, and the third wiring layer 700 and the second semiconductor device 500 are electrically connected through the third via hole 610. The first wiring layer 300 and the third wiring layer 700 may also be electrically connected through a via hole provided in the third packaging layer 600.

In this embodiment, the positioning bulges 520 of the second semiconductor device 500 may be enveloped within the third packaging layer 600, or it may also be exposed to third packaging layer 600, e.g., the upper surface of the positioning bulge 520 is flush with the upper surface of the third packaging layer 600. The second semiconductor device 500 and the first wiring layer 300 may be connected by soldering or gluing, since a deviation in position accuracy of second semiconductor device 500 with respect to the first semiconductor device 100 may occur during the process of soldering or gluing, when processing the third via hole 610 in the third packaging layer 600, if anchor point(s) in the package frame 400 or the first semiconductor device 100 is used for processing the via hole, the process accuracy of via hole is relatively poor, so that the configuration of providing the positioning bulge 520 on the second semiconductor device 500 can improve the position accuracy of the third via hole 610.

In the multiple layered stack structure as shown in FIG. 13, the via hole of each layer takes the positioning bulge (in the same layer) on the semiconductor device as the processing identification point, so as to avoid accumulation of position error in the stack structure, and thereby improve the processing accuracy of via hole.

Figure 14:
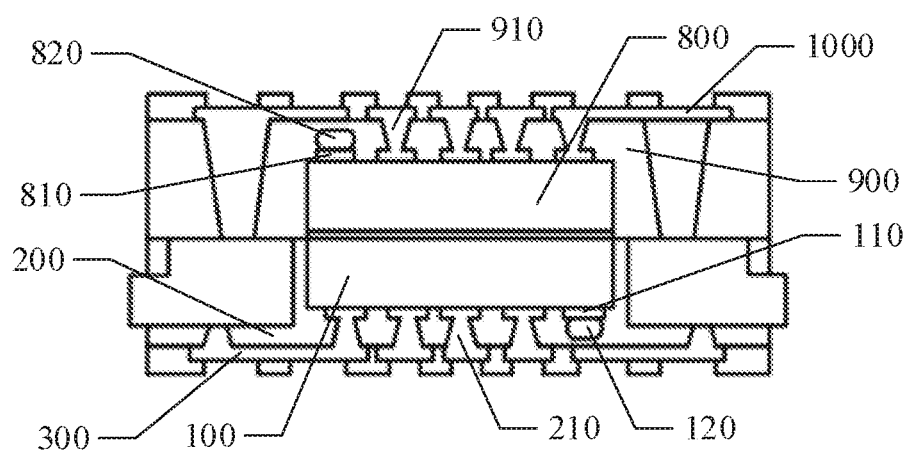
FIG. 14 is a structural schematic diagram of an eighth embedded packaging module according to the present disclosure.

As shown in FIG. 14, the embedded packaging module further comprises a third semiconductor device 800, a second packaging layer 900 and a second wiring layer 1000. The third semiconductor device 800 has a first face and a second face, at least two positioning bulges 820 (only one is shown in the figure) and at least one bonding pad 810 are provided on the first face of the third semiconductor device 800, and the second face of the first semiconductor device 100 is connected with the second face of the third semiconductor device 800 by a connection layer, e.g. The second packaging layer 900 is formed on both the first face of the third semiconductor device 800 and a face adjacent to the first face, and the positioning bulges 820 of the third semiconductor device 800 are positioned in the second packaging layer 900. At least one fourth via hole 910 is provided in the second packaging layer 900, the bottom of the fourth via hole 910 is positioned in the region of the bonding pad 810 of the third semiconductor device 800 and contacts the bonding pad 810. The projections of the fourth via hole 910 and the positioning bulge 820 on the first face of the third semiconductor device 800 do not overlap. The second wiring layer 1000 is positioned on the side of the second packaging layer 900 away from the first semiconductor device 100, and is electrically connected with the bonding pad 810 by the fourth via hole 910.

In this embodiment, the positioning bulges 820 may be enveloped within the second packaging layer 900), or it may also be exposed to second packaging layer 900, e.g., the upper surface of the positioning bulge 820 is flush with the upper surface of the second packaging layer 900. The first semiconductor device 100 and the third semiconductor device 800 are arranged back-to-back, and the first semiconductor device 100 and the third semiconductor device 800 are connected by means of soldering or gluing, since an offset of the position of the third semiconductor device 800 with respect to the first semiconductor device 100 may occur during the process of soldering or gluing, if anchor point(s) in the package frame 400 or the first semiconductor device 100 is used for processing the via hole, the process accuracy is poor, so that the configuration of providing the second positioning bulge 820 on the third semiconductor device 800 can improve the position accuracy of the fourth via hole 910.

Figure 15:
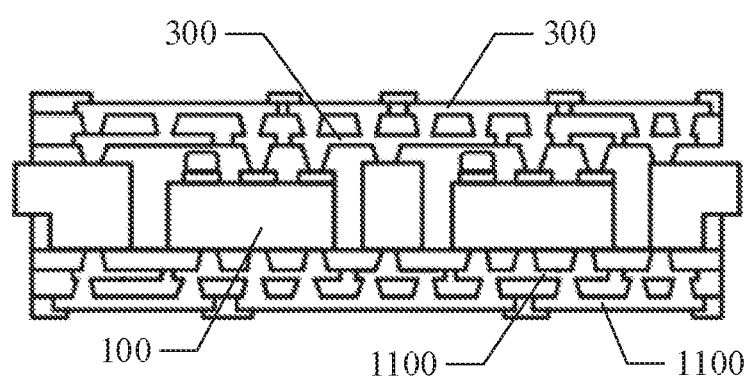
FIG. 15 is a structural schematic diagram of a ninth embedded packaging module according to the present disclosure.

As shown in FIG. 15, the first wiring layer 300 comprises one or more layers, at least one fourth wiring layer 1100 is provided on the second face of the first semiconductor device 100, and the number of layers in the first wiring layer 300 is identical to that of the fourth wiring layer 1100. A multilayer wiring structure can provide a more flexible wiring mode, and the two face of the semiconductor device having the same number of wiring layer which can reduce the wrap of the packaging module. In contrast to a single wiring layer structure, this multi-wiring layer structure increases the heat dissipation path of the embedded packaging module, and thereby the heat dissipation capacity and reliability of the embedded packaging module is improved.

Figure 16:
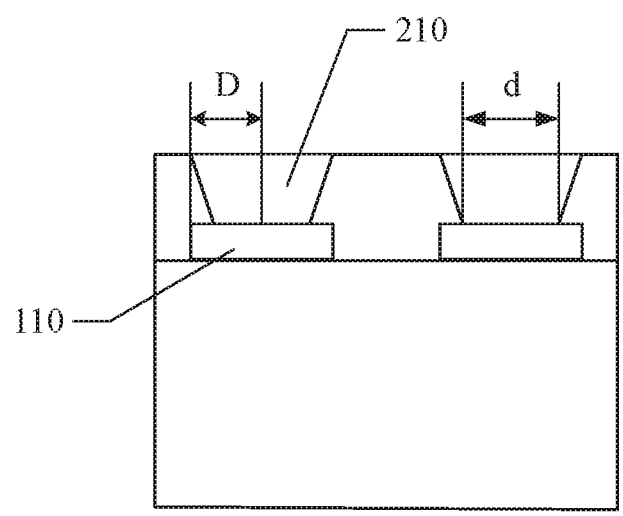
FIG. 16 is a schematic diagram illustrating a position relation of the via holes and the bonding pad in accordance to the present disclosure.
Figure 17:
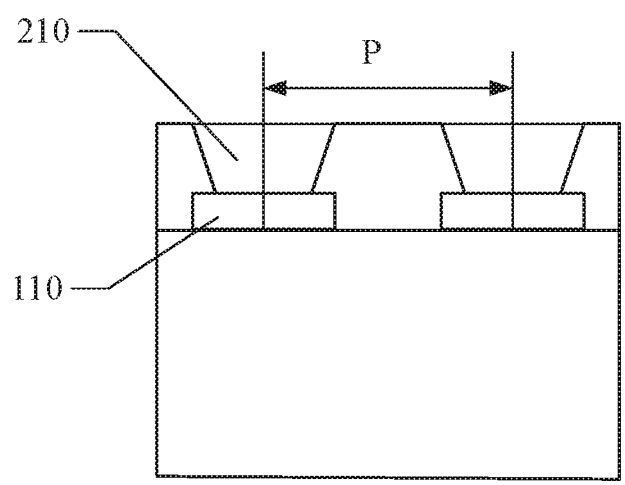
FIG. 17 is a schematic diagram illustrating another position relation of the via holes and the bonding pad in accordance to the present disclosure.

The embedded packaging module provided by the embodiments of the present disclosure has an improved position accuracy of via hole by providing the positioning bulge on the semiconductor device and taking the positioning bulge as the laser processing identification point for the via hole processing. As shown in FIGS. 16 and 17, D is the drilling position deviation, d is the diameter of via hole, and P is the pitch of the adjacent bonding pads. By providing the positioning bulge on the semiconductor device, the problems of the lead frame processing deviation, the semiconductor device SMD deviation, and ABF (Ajinomoto Build-Up Film, Ajinomoto synthetic film) press-bonding semiconductor device offset deviation that are included in the drilling position deviation of the related art can be solved, and that the drilling position deviation can be reduced from 30 um to 5 um. Providing both the positioning bulge and the via hole on the surface of the semiconductor device at the same time, which can not only improve the positional accuracy of laser drilling, but also permit a large electrical that coincides with the power module flowing through. The decrease of laser drilling position deviation D contributes to improve the process yield, to improve the current-flowing capacity of the module, the heat dissipation capacity and the reliability of the package.

The decrease of drilling position deviation D may allow an increase of diameter d of via hole on the connection portion of the via hole and the semiconductor device bonding pad, and may also allow an increase of number of via hole on a single bonding pad, so that the current-flowing capability of via hole and the heat dissipation capacity of chip can be improved, and the reliability of packaging is thereby improved. The decrease of drilling position deviation D may allow a decrease of pitch P between two chip bonding pad, and achieve a packaging of semiconductor device with small pitch of bonding pads.

Figure 18:
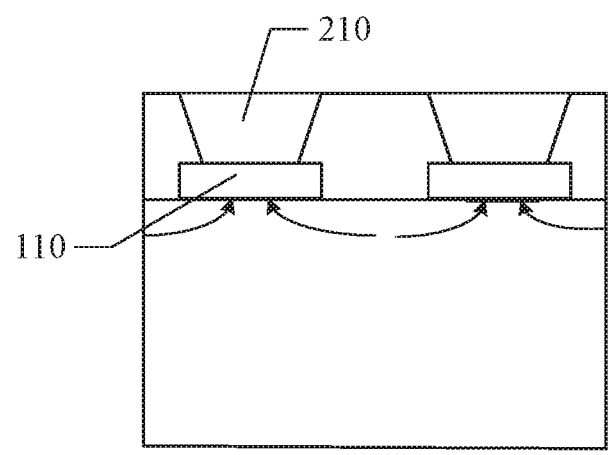
FIG. 18 is a schematic diagram of current direction according to the present disclosure.

The current direction from the unit cell to the bonding pad, as shown in FIG. 18. The increase of the diameter d of via hole, the increase of number of via hole on a single bonding pad, and the decrease of pitch of the bonding pad, these all can reduce the lateral distance that the current flow from the unit cell to the bonding pad, and thereby reduce the internal resistance of the semiconductor device.

Figure 19:
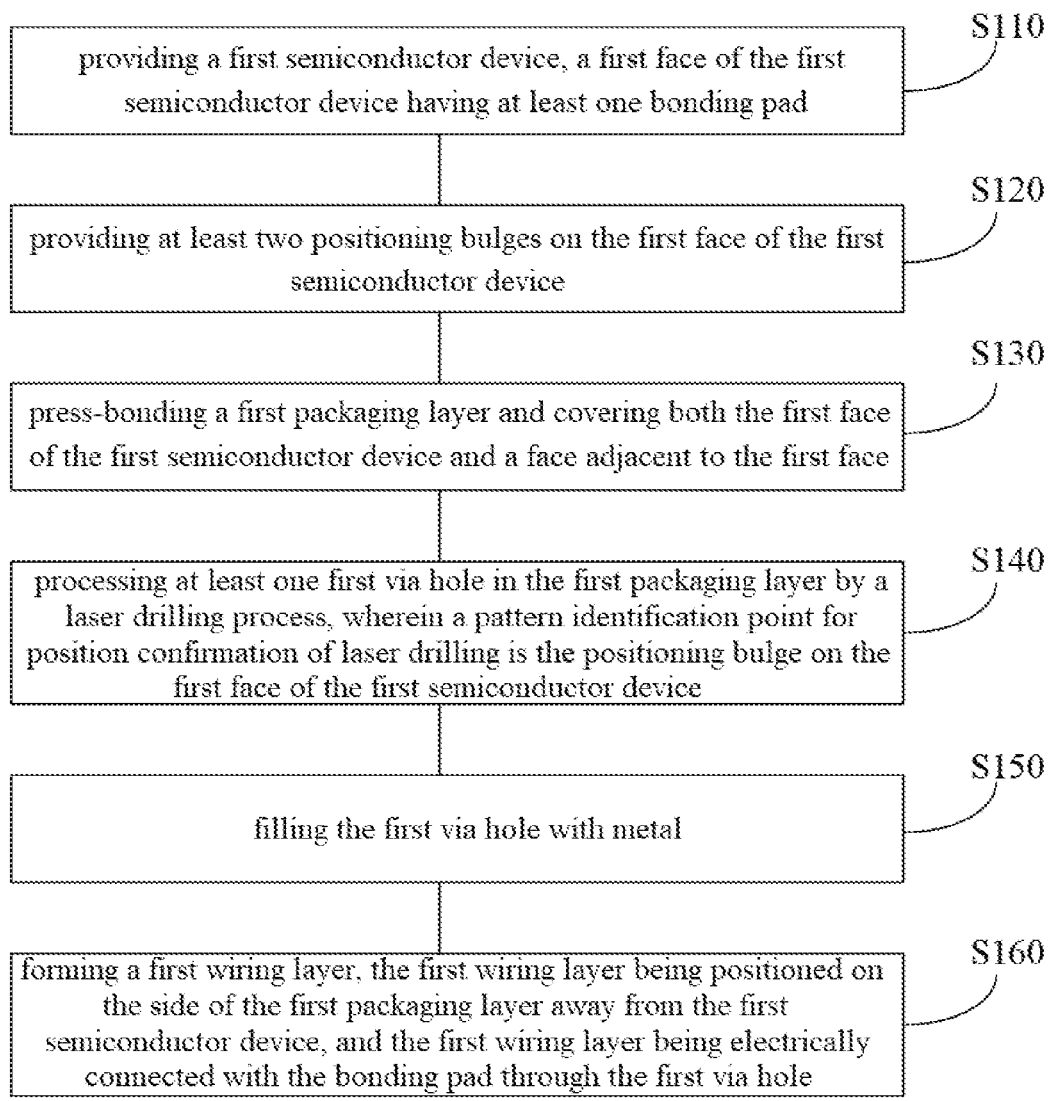
FIG. 19 is a flow diagram of a manufacturing method of embedded packaging module according to the present disclosure.

In some embodiments, a manufacturing method for an embedded packaging module is firstly provided, as shown in FIG. 19, the method comprising:

Step S110, providing a first semiconductor device 100, a first face of the first semiconductor device 100 having at least one bonding pad 110;

Step S120, providing at least two positioning bulges 120 on the first face of the first semiconductor device 100;

Step S130, press-bonding a first packaging layer 200, and covering both the first face of the first semiconductor device 100 and a face adjacent to the first face;

Step S140, processing at least one first via hole 210 in the first packaging layer 200 by a laser drilling processing, wherein a pattern identification point for position confirmation of laser drilling is the positioning bulge 210 on the first face of the first semiconductor device 100, such that the bottom of the first via hole 210 being positioned in the region of the bonding pad 110 and contacting the bonding pad 110, and that the projections of the first via hole 210 and the positioning bulges 120 on the first face of the first semiconductor device 100 doing not overlap;

Step S150, filling the first via hole 210 with metal;

Step S160, forming a first wiring layer 300, the first wiring layer 300 being positioned on the side of the first packaging layer 200 away from the first semiconductor device 100, and the first wiring layer 300 being electrically connected with the bonding pad 110 through the first via hole 210.

The manufacturing method for an embedded packaging module as presented in the embodiment of the disclosure improves the processing accuracy of the via hole in the corresponding packaging layer, by providing at least two positioning bulges 120 on the first face of the semiconductor device as anchor points in the processing of via hole, and also satisfies the need of large current flowing through the via hole. As the processing accuracy of the via hole improves, the number of via hole in the bonding pad may be increased, so as to further improve the current-flowing capability on the bonding pad and the heat dissipation capacity, and thereby to improve the reliability of packaging.

In the step S120, at least two positioning bulges 120 may be provided on the first face of the first semiconductor device 100 by a ball bonding process or an electroplating process, at least two positioning bulges 120 may be provided on one and the same bonding pad 110, or each of the positioning bulges 120 may be positioned on a bonding pad 110. For example, three positioning bulges 120, one of which is positioned on one bonding pad 110, and the other two are positioned on another bonding pad 110. Naturally, in the practical application, the positioning bulge 120 may also be provided on a region of the first face of the semiconductor device that is not occupied by the bonding pad 110, and so on, the embodiments of the present disclosure make no specific limitation thereto.

In the step S130, the first packaging layer 200 may be press-bonded and cover the first face of the first semiconductor device 100 and a face adjacent to the first face, the first packaging layer 200 may be a plastic layer.

When the embedded packaging module further comprises the package frame 400, (the method) may further comprise, before the step S120, adhering an adhesive tape to one end surface of the package frame 400, and bringing the semiconductor device into the package frame 400, the first face of the semiconductor device is away from the end surface of the package frame 400 to which the adhesive tape is adhered; and (the method) may further comprises, after the step S120, press-bonding the plastic layer on the second face of the semiconductor device.

In the step S140, at least one first via hole 210 may be processed on the first packaging layer 200 by a laser drilling processing. In the embodiment, the pattern identification point for position confirmation of the laser drilling is the positioning bulge 120 on the first face of the first semiconductor device 100, so that the bottom of the first via hole 210 is positioned in the region of the bonding pad 110 and contact the bonding pad 110, and that the projections of the positioning bulges of the first via hole 210 and the positioning bulges 120 on the first face of the first semiconductor device 100 do not overlap.

By taking the positioning bulges 120 as the identification points of the pattern, the positional accuracy of the first via hole is improved. The decrease of the laser drilling position deviation D contributes to improve quality of the manufacturing process, and to improve the flowing capacity of the module, the heat dissipation capacity and the reliability of the package.

In the step S150 and the step S160, an electroplating process may be used for filling the first via hole 210 and forming the first wiring layer 300. The first via hole 210 and the first wiring layer 300 may be formed by one-time electroplating or separate electroplating.

It should be noted that although each of the steps in the method of the present disclosure are described in a particular order, which however does not request that these steps must be performed in this order, nor that the desired result can only be achieved upon the performance of all these steps. Additionally, or alternatively, some of the steps may be omitted, a number of steps may be combined into a single step and/or a single step may be splitted into a number of steps to perform the same.

Other embodiments of the present disclosure will be apparent to those skilled in the art after reading the specification and implementing the invention disclosed herein. The present application is intended to cover any variations, purposes, or adaptations of the present disclosure, which are in accordance with the general principles of the present disclosure and include common general knowledge or conventional technical means in the art that are not disclosed in the present disclosure. The specification and embodiments are to be regarded as illustrative only, while the real scope and spirit of the present disclosure is defined by the attached claims.

What is claimed is:

1. An embedded packaging module, comprising:
a first semiconductor device having a first face and a second face, at least two positioning bulges and one or more bonding pad being provided on the first face of the first semiconductor device;
a first packaging layer formed on both the first face of the first semiconductor device and a face adjacent to the first face, the positioning bulges being positioned in the first packaging layer, one or more first via hole being provided in the first packaging layer, and the bottom of the first via hole being positioned in the bonding pad and directly contacting with the bonding pad; and
a first wiring layer positioned on a side of the first packaging layer away from the first semiconductor device, and being electrically connected with the bonding pad through the first via hole,
wherein the positioning bulges are taken as identification points for processing the first via hole.

2. The embedded packaging module of claim 1, wherein at least one positioning bulge of the at least two positioning bulges is provided on the bonding pad.

3. The embedded packaging module of claim 2, wherein at least one of the first via hole is also provided on the bonding pad on which the positioning bulge is provided.

4. The embedded packaging module of claim 1, wherein the projections of the first via hole and the positioning bulges on the first face of the first semiconductor device do not overlap.

5. The embedded packaging module of claim 1, wherein the positioning bulges are enveloped within the first packaging layer, and one or more second via hole is also provided in the first packaging layer, at least part of the positioning bulges is provided on at least one of the bonding pads, and the second via hole contacts with the positioning bulge provided on the bonding pad and the projections of the second via hole and the positioning bulge on the first face of the first semiconductor device at least partly overlap.

6. The embedded packaging module of claim 5, in which the second via hole is electrically connected with the first wiring layer.

7. The embedded packaging module of claim 1 further comprises a package frame having a holding region, wherein the first semiconductor device is provided in the holding region.

8. The embedded packaging module of claim 7, wherein the number of the first semiconductor device is more than one, and the first semiconductor devices are all provided in the holding region.

9. The embedded packaging module of claim 7, wherein the number of the first semiconductor device is more than one, the number of the holding region is more than one, and at least one of the first semiconductor devices is provided in each of the holding regions.

10. The embedded packaging module of claim 7, wherein the package frame includes a plurality of metal blocks that are not connected with one another, and at least one of the first semiconductor devices is electrically connected with at least one of the metal blocks through the first via hole.

11. The embedded packaging module of claim 1 further comprises a package frame, the first semiconductor device and the package frame are stacked.

12. The embedded packaging module of claim 1 further comprising:
one or more second semiconductor device having a first face and a second face, at least two positioning bulges and one or more bonding pad being provided on the first face of the second semiconductor device, and the second face of the second semiconductor device being connected with the first wiring layer;
a third packaging layer formed on the side of the first wiring layer away from the first semiconductor device and covering the second semiconductor device, the positioning bulges of the second semiconductor device being positioned in the third packaging layer, one or more third via hole being provided in the third packaging layer, and the bottom of the third via hole being positioned in the region of the bonding pad of the second semiconductor device and contacting the bonding pad of the second semiconductor device;
the projections of the third via hole and the positioning bulges of the second semiconductor device on the first face of the second semiconductor device do not overlap; and
a third wiring layer formed on the third packaging layer.

13. The embedded packaging module of claim 1 further comprising:
a third semiconductor device, at least two positioning bulges and one or more bonding pad being provided on a first face of the third semiconductor device, the second face of the first semiconductor device and a second face of the third semiconductor device being connected by a connection layer;
a second packaging layer formed on both the first face of the third semiconductor device and a face adjacent to the first face, the positioning bulges of the third semiconductor device being positioned in the second packaging layer, one or more fourth via hole being provided in the second packaging layer, and the bottom of the fourth via hole being positioned in the region of the bonding pad of the third semiconductor device and contacting the bonding pad of the third semiconductor device; the projections of the fourth via hole and the positioning bulges of the third semiconductor device on the first face of third semiconductor device do not overlap;
a second wiring layer being positioned on the side of the second packaging layer away from the first semiconductor device, and being electrically connected with the bonding pad of the third semiconductor device through the fourth via hole.

14. The embedded packaging module of claim 1, wherein the positioning bulges are exposed to the first packaging layer, and the positioning bulges are electrically connected with the first wiring layer.

15. The embedded packaging module of claim 1, wherein the first via hole is a metal solid via hole.

16. The embedded packaging module of claim 1, wherein the first wiring layer comprises one or more layers, at least one layer of fourth wiring layer is provided on the second face of the first semiconductor device, and the number of layers of the first wiring layer is identical to that of the fourth wiring layer.

* * * * *